(12) United States Patent
Guterman et al.

(10) Patent No.: US 8,072,817 B2
(45) Date of Patent: Dec. 6, 2011

(54) TRACKING CELLS FOR A MEMORY SYSTEM

(75) Inventors: Daniel C Guterman, Fremont, CA (US); Stephen J Gross, Cupertino, CA (US); Shahzad Khalid, Union City, CA (US); Geoffrey S Gongwer, Los Altos, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/031,041

(22) Filed: Feb. 18, 2011

(65) Prior Publication Data

US 2011/0141816 A1 Jun. 16, 2011

Related U.S. Application Data

(60) Division of application No. 12/763,569, filed on Apr. 20, 2010, now Pat. No. 7,916,552, which is a division of application No. 11/752,008, filed on May 22, 2007, now Pat. No. 7,760,555, which is a continuation of application No. 10/461,244, filed on Jun. 13, 2003, now Pat. No. 7,237,074.

(51) Int. Cl.
*G11C 16/04* (2006.01)

(52) U.S. Cl. .............................. 365/185.28; 365/185.03

(58) Field of Classification Search .............. 365/185.28
See application file for complete search history.

(56) References Cited

U.S. PATENT DOCUMENTS

| | | |
|---|---|---|
| 4,802,166 A | 1/1989 | Casagrande et al. |
| 4,949,307 A | 8/1990 | Campardo |
| 4,974,206 A | 11/1990 | Iyama et al. |
| 5,010,518 A | 4/1991 | Toda |
| 5,081,610 A | 1/1992 | Olivo et al. |
| 5,095,344 A | 3/1992 | Harari |
| 5,142,496 A | 8/1992 | Van Buskirk |
| 5,172,338 A | 12/1992 | Mehrotra et al. |
| 5,198,997 A | 3/1993 | Arakawa |
| 5,267,202 A | 11/1993 | Dallabora et al. |
| 5,270,979 A | 12/1993 | Harari et al. |
| 5,287,315 A | 2/1994 | Schreck et al. |

(Continued)

FOREIGN PATENT DOCUMENTS

EP 0814480 A1 12/1997

(Continued)

OTHER PUBLICATIONS

Response to Office Action dated Aug. 18, 2011, Chinese Patent Application No. 200480021210.3.

(Continued)

*Primary Examiner* — Jason Lappas
(74) *Attorney, Agent, or Firm* — Vierra Magen Marcus & DeNiro LLP

(57) ABSTRACT

Tracking cells are used in a memory system to improve the read process. The tracking cells can provide an indication of the quality of the data and can be used as part of a data recovery operation if there is an error. The tracking cells provide a means to adjust the read parameters to optimum levels in order to reflect the current conditions of the memory system. Read operations are performed on the tracking cells, where threshold voltages of physical states of the tracking cells are further apart than threshold voltages of physical states of non-tracking cells. Based on the read operations, an extent to which the tracking cells are errored is determined.

12 Claims, 10 Drawing Sheets

U.S. PATENT DOCUMENTS

| | | | |
|---|---|---|---|
| 5,293,345 | A | 3/1994 | Iwahashi |
| 5,311,466 | A | 5/1994 | Natale et al. |
| 5,383,070 | A | 1/1995 | Bond |
| 5,386,388 | A | 1/1995 | Atwood et al. |
| 5,408,148 | A | 4/1995 | Pascucci et al. |
| 5,418,752 | A | 5/1995 | Harari et al. |
| 5,463,586 | A | 10/1995 | Chao et al. |
| 5,493,533 | A | 2/1996 | Lambrache |
| 5,504,760 | A | 4/1996 | Harari et al. |
| 5,532,623 | A | 7/1996 | Advani et al. |
| 5,532,962 | A | 7/1996 | Auclair et al. |
| 5,537,358 | A | 7/1996 | Fong |
| 5,541,886 | A | 7/1996 | Hasbun |
| 5,608,676 | A | 3/1997 | Medlock et al. |
| 5,629,892 | A | 5/1997 | Tang |
| 5,642,308 | A | 6/1997 | Yoshida |
| 5,657,332 | A | 8/1997 | Auclair et al. |
| 5,659,550 | A | 8/1997 | Mehrotra et al. |
| 5,684,739 | A | 11/1997 | Takeuchi |
| 5,687,114 | A | 11/1997 | Khan |
| 5,712,189 | A | 1/1998 | Plumton et al. |
| 5,754,475 | A | 5/1998 | Bill et al. |
| 5,774,395 | A | 6/1998 | Richart et al. |
| 5,787,038 | A | 7/1998 | Park |
| 5,802,166 | A | 9/1998 | Garcia et al. |
| 5,818,759 | A | 10/1998 | Kobayashi |
| 5,828,601 | A | 10/1998 | Hollmer et al. |
| 5,828,602 | A | 10/1998 | Wong |
| 5,847,996 | A | 12/1998 | Guterman et al. |
| 5,862,080 | A | 1/1999 | Harari et al. |
| 5,864,569 | A | 1/1999 | Roohparvar |
| 5,877,986 | A | 3/1999 | Harari et al. |
| 5,886,927 | A | 3/1999 | Takeuchi |
| 5,889,702 | A | 3/1999 | Gaultier et al. |
| 5,912,838 | A | 6/1999 | Chevallier |
| 5,936,888 | A | 8/1999 | Sugawara |
| 5,936,906 | A | 8/1999 | Tsen |
| 5,946,238 | A | 8/1999 | Campardo et al. |
| 5,966,330 | A | 10/1999 | Tang et al. |
| 5,973,959 | A | 10/1999 | Gerna et al. |
| 5,982,662 | A | 11/1999 | Kobayashi et al. |
| 6,002,152 | A | 12/1999 | Guterman et al. |
| 6,002,614 | A | 12/1999 | Banks |
| 6,016,272 | A | 1/2000 | Gerna et al. |
| 6,016,276 | A | 1/2000 | Fuji |
| 6,021,068 | A | 2/2000 | Miki et al. |
| 6,028,791 | A | 2/2000 | Tanaka |
| 6,055,187 | A | 4/2000 | Dallabora et al. |
| 6,094,368 | A | 7/2000 | Ching |
| 6,103,573 | A | 8/2000 | Harari et al. |
| 6,151,248 | A | 11/2000 | Harari et al. |
| 6,209,113 | B1 | 3/2001 | Roohparvar |
| 6,219,277 | B1 | 4/2001 | Devin et al. |
| 6,222,762 | B1 | 4/2001 | Guterman et al. |
| 6,275,419 | B1 | 8/2001 | Guterman et al. |
| 6,278,632 | B1 | 8/2001 | Chevallier |
| 6,282,145 | B1 | 8/2001 | Tran et al. |
| 6,304,485 | B1 | 10/2001 | Harari et al. |
| 6,314,014 | B1 | 11/2001 | Lowrey et al. |
| 6,317,363 | B1 | 11/2001 | Guterman et al. |
| 6,381,659 | B2 | 4/2002 | Proch |
| 6,426,893 | B1 | 7/2002 | Conley et al. |
| 6,512,263 | B1 | 1/2003 | Yuan et al. |
| 6,538,922 | B1 | 3/2003 | Khalid et al. |
| 6,678,192 | B2 | 1/2004 | Gongwer et al. |
| 6,894,926 | B2 | 5/2005 | Guterman et al. |
| 7,237,074 | B2 | 6/2007 | Guterman et al. |
| 7,681,094 | B2 | 3/2010 | Guterman et al. |
| 7,760,555 | B2 | 7/2010 | Guterman et al. |
| 2002/0126528 | A1 | 9/2002 | Conley et al. |
| 2002/0163838 | A1 | 11/2002 | Guterman et al. |
| 2003/0086293 | A1 | 5/2003 | Gongwer |
| 2003/0217323 | A1 | 11/2003 | Guterman et al. |
| 2005/0219896 | A1* | 10/2005 | Chen et al. ............... 365/185.03 |
| 2010/0202199 | A1 | 8/2010 | Guterman et al. |

FOREIGN PATENT DOCUMENTS

| | | |
|---|---|---|
| EP | 0936627 A1 | 8/1999 |
| EP | 0961285 A1 | 12/1999 |
| EP | 0978844 A1 | 2/2000 |
| EP | 0987715 A1 | 3/2000 |
| EP | 1096501 A1 | 5/2001 |
| FR | 2778012 A1 | 4/1998 |
| JP | 4291940 | 10/1992 |
| JP | 9139089 | 5/1997 |
| JP | 9219095 | 8/1997 |
| JP | 10134587 | 5/1998 |
| JP | 11066875 | 3/1999 |
| JP | 9270195 | 10/1999 |
| JP | 11274437 | 10/1999 |
| JP | 2000057783 | 2/2000 |
| KR | 970029866 | 6/1997 |
| WO | WO9520224 | 7/1995 |
| WO | WO9803978 | 1/1998 |
| WO | WO9908284 | 2/1999 |
| WO | WO0042615 | 7/2000 |
| WO | WO0227729 A2 | 4/2002 |
| WO | WO03100791 A1 | 12/2003 |

OTHER PUBLICATIONS

English translation of Amended Claims filed in Response to Office Action dated Aug. 18, 2011, Chinese Patent Application No. 200480021210.3.
Office Action dated May 4, 2011, Chinese Patent Application No. 200480021210.3.
European Office Action dated Nov. 3, 2008, European Patent Application No. 04754703.9.
Chinese Office Action dated Oct. 31, 2008, Chinese Patent Application No. 2004800212103.
"Communication Relating to the Results of the Partial International Search," from International Application No. PCT/US01/30123, Sep. 20, 2002, 9 pages.
Office Action dated Feb. 7, 2006, U.S. Appl. No. 10/461,244, filed Jun. 13, 2003.
Amendment dated Jun. 30, 2006, U.S. Appl. No. 10/461,244, filed Jun. 13, 2003.
Office Action dated Sep. 22, 2006, U.S. Appl. No. 10/461,244, filed Jun. 13, 2003.
Amendment dated Oct. 26, 2006, U.S. Appl. No. 10/461,244, filed Jun. 13, 2003.
Notice of Allowance dated Mar. 6, 2007, U.S. Appl. No. 10/461,244, filed Jun. 13, 2003.
Office Action dated Dec. 22, 2009, U.S. Appl. No. 11/752,008, filed May 22, 2007.
Amendment dated Jan. 6, 2010, U.S. Appl. No. 11/752,008, filed May 22, 2007.
Notice of Allowance dated Mar. 11, 2010, U.S. Appl. No. 11/752,008, filed May 22, 2007.
Notice of Allowance dated Oct. 30, 2009, U.S. Appl. No. 11/752,024, filed May 22, 2007.
Restriction Requirement dated Dec. 23, 2010, U.S. Appl. No. 12/763,569, filed Apr. 20, 2010.
Response to Restriction Requirement dated Jan. 19, 2011, U.S. Appl. No. 12/763,569, filed Apr. 20, 2010.
Notice of Allowance dated Jan. 31, 2011, U.S. Appl. No. 12/763,569, filed Apr. 20, 2010.
English Abstract of French Publication No. FR2778012 published on Apr. 28, 1998.
English Abstract of Japanese Publication No. JP10134587 published on May 22, 1998.
English Abstract of Japanese Publication No. JP11066875 published on Mar. 9, 1999.
English Abstract of Japanese Publication No. JP11274437 published on Oct. 8, 1999.
English Abstract of Japanese Publication No. JP2000057783 published on Feb. 25, 2000.
English Abstract of Japanese Publication No. JP4291940 published on Oct. 16, 1992.
English Abstract of Japanese Publication No. JP9139089 published on May 27, 1997.
English Abstract of Japanese Publication No. JP9219095 published on Aug. 19, 1997.
English Abstract of Japanese Publication No. JP9270195 published on Oct. 14, 1997.
English Abstract of PCT Publication No. WO9803978 published on Jan. 29, 1998.

* cited by examiner

Fig. 5

| FUNCTION BEING PERFORMED ON CELL | SELECT GATE (WORD LINE) | LEFT BIT LINE (BL–LEFT) | LEFT STEERING GATE | RIGHT STEERING GATE | RIGHT BIT LINE (BL-RIGHT) |
|---|---|---|---|---|---|
| (1) UNSELECTED ROW | 0 | X | X | X | X |
| (2) ERASE (TO WORDLINE) | $V_E$ | 5 | 0 | 0 | 5 |
| (3) READ LEFT FLOATING GATE | $V_{SR}$ | 0 | $V_M$ | $V_{BR}$ | 1 |
| (4) READ RIGHT FLOATING GATE | $V_{SR}$ | 1 | $V_{BR}$ | $V_M$ | 0 |
| (5) PROGRAM LEFT FLOATING GATE | $V_{SP}$ | 5 | $V_P$ | $V_{BP}$ | 0 |
| (6) PROGRAM RIGHT FLOATING GATE | $V_{SP}$ | 0 | $V_{BP}$ | $V_P$ | 5 |
| (7) NO PROGRAM IN SELECTED ROW | $V_{SP}$ | 5 | X | X | 5 |
| (8) ERASE (TO CHANNEL) [WITH VOLTAGES OF BOTH THE p-well AND n-well EQUAL TO $V_e$, AND THE SUBSTRATE AT ZERO VOLTS] | $V_{SE}$ | FLOAT | 0 | 0 | FLOAT |

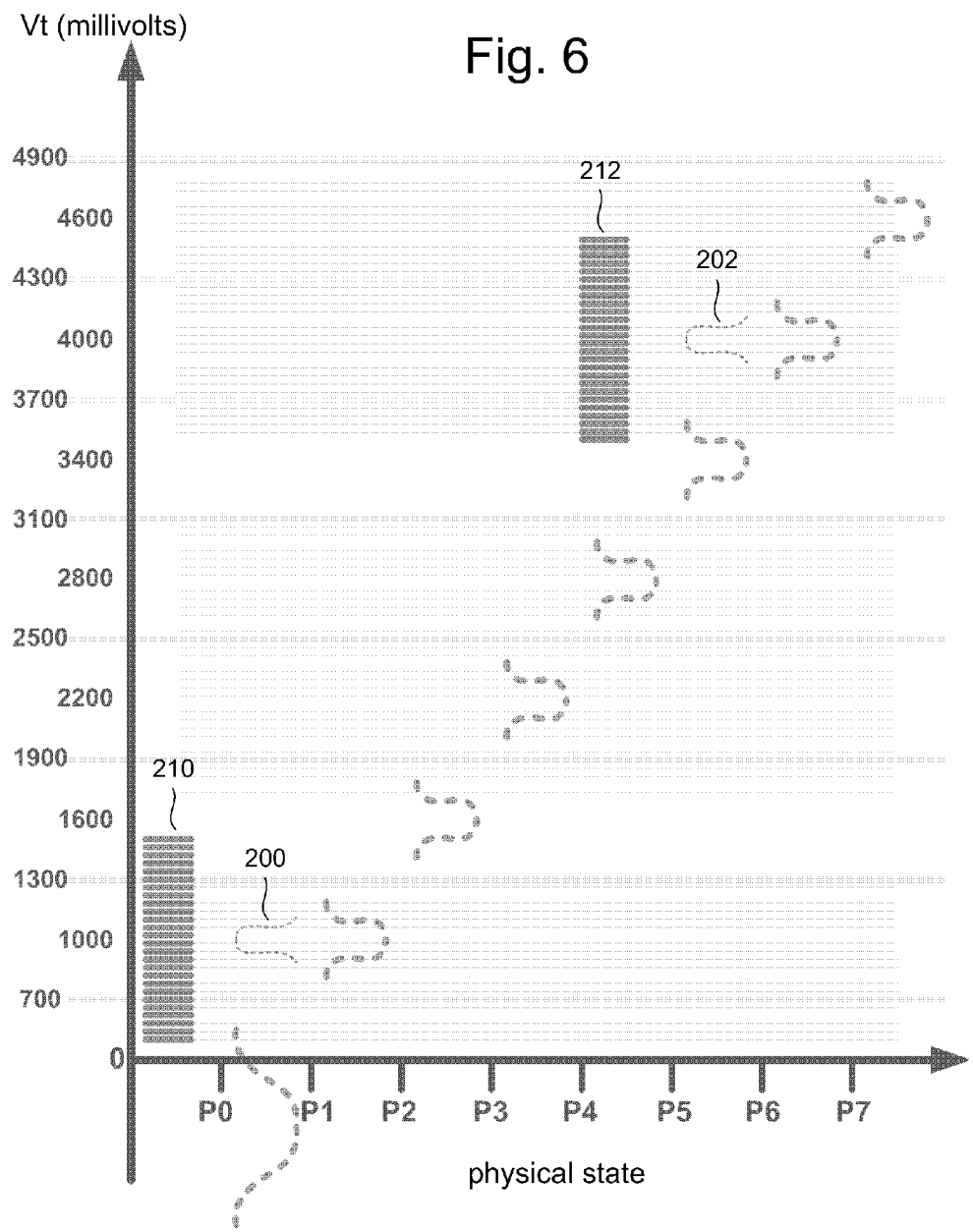

Fig. 7

| Logical State | Binary Data |
|---|---|
| L0 | 000 |
| L1 | 001 |
| L2 | 011 |
| L3 | 010 |
| L4 | 110 |
| L5 | 111 |
| L6 | 101 |
| L7 | 100 |

Fig. 8

|  | Rotation 0 | Rotation 1 | Rotation 2 | Rotation 3 | Rotation 4 | Rotation 5 | Rotation 6 | Rotation 7 |
|---|---|---|---|---|---|---|---|---|
| Physical State P0 | L0 | L7 | L6 | L5 | L4 | L3 | L2 | L1 |
| Physical State P1 | L1 | L0 | L7 | L6 | L5 | L4 | L3 | L2 |
| Physical State P2 | L2 | L1 | L0 | L7 | L6 | L5 | L4 | L3 |
| Physical State P3 | L3 | L2 | L1 | L0 | L7 | L6 | L5 | L4 |
| Physical State P4 | L4 | L3 | L2 | L1 | L0 | L7 | L6 | L5 |
| Physical State P5 | L5 | L4 | L3 | L2 | L1 | L0 | L7 | L6 |
| Physical State P6 | L6 | L5 | L4 | L3 | L2 | L1 | L0 | L7 |
| Physical State P7 | L7 | L6 | L5 | L4 | L3 | L2 | L1 | L0 |

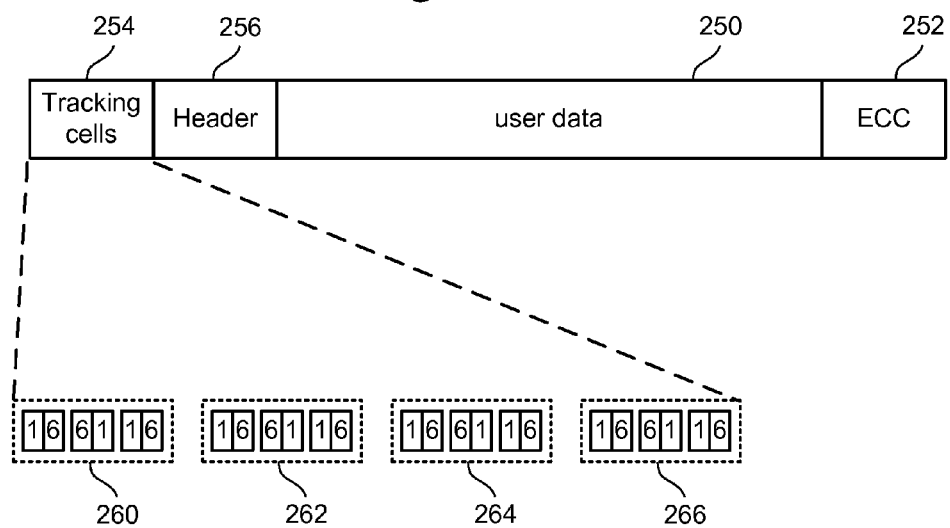

| State | 1st Pass | 2nd Pass | 3rd Pass | 4th Pass | 5th Pass | 6th Pass | 7th Pass |
|---|---|---|---|---|---|---|---|
| P0 | on | on | on | on | on | on | on |
| P1 | off | on | on | on | on | on | on |
| P2 | off | off | on | on | on | on | on |
| P3 | off | off | off | on | on | on | on |
| P4 | off | off | off | off | on | on | on |
| P5 | off | off | off | off | off | on | on |
| P6 | off | off | off | off | off | off | on |
| P7 | off | off | off | off | off | off | off |

TRACKING CELLS FOR A MEMORY SYSTEM

CROSS-REFERENCE TO RELATED APPLICATIONS

This application is a divisional of, commonly assigned U.S. patent application Ser. No. 12/763,569, filed Apr. 20, 2010, and published on Aug. 12, 2010 as US2010/0202199, and issued on Mar. 29, 2011 as U.S. Pat. No. 7,916,552, which in turn is a divisional of commonly assigned U.S. patent application Ser. No. 11/752,008, filed May 22, 2007, and issued on Jul. 20, 2010 as U.S. Pat. No. 7,760,555, which in turn is a continuation of commonly assigned U.S. patent application Ser. No. 10/461,244, filed Jun. 13, 2003, and issued on Jun. 26, 2007 as U.S. Pat. No. 7,237,074, all of which are incorporated herein by reference.

BACKGROUND OF THE INVENTION

1. Field of the Invention

The present invention is directed to technology for reading memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistors is controlled by the amount of charge that is retained on the floating gate. That is, the minimum amount of voltage that must be applied to the control gate before the transistor is turned on to permit conduction between its source and drain is controlled by the level of charge on the floating gate.

Many EEPROMs and flash memories have a floating gate that is used to store two ranges of charges and, therefore, the memory cell can be programmed/erased between two states. Such memory cells store one bit of data. Other EEPROMs and flash memory cells store multiple ranges of charge and, therefore, such memory cells can be programmed to multiple states. Such memory cells store multiple bits of data. The size and parameters of the threshold voltage window depends on the device characteristics, operating conditions and history.

Conventional EEPROMs and flash memories can experience endurance related stress each time the device goes through an erase and program cycle. The endurance of a flash memory is its ability to withstand a given number of program and erase cycles. With use, defects tend to build up in the memory device and may eventually render the device unreliable. One physical phenomenon limiting the endurance of prior flash memory devices is the trapping of electrons in the active dielectric between the floating gate and the substrate. During programming, electrons are injected from the substrate to the floating gate through the dielectric. Similarly, during erasing, electrons are extracted from the floating gate through the dielectric. In both cases, electrons can be trapped by the dielectric. The trapped electrons oppose the applied electric field and subsequent program/erase cycles, thereby causing the programmed threshold voltage to shift to a lower value and the erased threshold voltage to shift to a higher value. This can be seen in a gradual closure of the voltage window between the programmed and erased states. If program/erase cycling is continued, the device may eventually experience catastrophic failure. This problem is even more critical if multi-state memory is implemented, since more accurate placement of the threshold voltage is demanded.

A second problem pertains to charge retention on the floating gate. For example, negative charge on the floating gate tends to diminish somewhat through leakage over a period of time. This causes the threshold voltage to shift to a lower value over time. Over the lifetime of the device, the threshold voltage may shift as much as one volt or more. In a multi-state device, this could shift the memory cell by one or two states.

A third problem is that the program/erase cycles may not be performed evenly for the cells in the memory device. For example, it is not uncommon that a repetitive pattern may be programmed continuously into a set of memory cells. Therefore, some cells will constantly be programmed and erased while other cells will never or rarely be programmed. Such uneven programming and erasing causes non-uniform stress conditions for the cells in a particular sector. Non-uniformity of the program/erase cycling histories can result in a wider distribution of threshold voltages for any particular given state. In addition to widening the threshold distributions, certain cells may reach closure of the voltage window, device failure or charge retention issues earlier than others.

SUMMARY OF THE INVENTION

The present invention, roughly described, pertains to tracking cells used to improve the read process of a memory system. In different embodiments, the tracking cells can be used as part of a data recovery operation, to provide an alarm indicating quality issues with the data and/or as a means to store an indication of how data is encoded in the memory. In one embodiment, the tracking cells are only used for data recovery if an Error Correction Code ("ECC") process is unable to correct an error in the data.

One embodiment of the present invention includes reading data stored in a memory system that includes a set of storage elements. The storage elements include data storage elements and tracking storage elements. The data storage elements are capable of storing rotatably encoded data in a set of multiple states. The tracking storage elements are read and categorized into tracking states. The tracking states correspond to a subset of the multiple states utilized by the data storage elements. A rotation scheme (i.e. the particular rotation encoding of choice) is determined based on the categorizing of the tracking storage elements. Some or all of the data storage elements are read using the determined rotation scheme. In one example of an implementation, the determining of the rotation scheme includes combining categorizations of two or more non-redundant tracking storage elements to create an identifier that is combined with other non-redundant identifiers to indicate the rotation scheme.

Another embodiment of the present invention includes performing multiple read operations for the tracking cells and recording error information during those read operations. A quality gauge is determined based on the recorded error information. If the quality gauge satisfies predetermined criteria, then a predetermined response is performed. The quality gauge can include an alarm if a predetermined number of tracking storage elements have errors, if a predetermined number of tracking cells have a threshold voltage that varies from an expected value by at least a predetermined value, or if a progressive set of error thresholds (e.g. different error levels over time) are exceeded. Examples of responses include aborting a read process, changing the parameters of an ECC operation and/or commencing a data recovery operation.

Some embodiments of the present invention include performing multiple read operations for each state of a subset of storage element states. The storage element states represent different data values for multi-state storage elements in the memory system. A current set of compare values for distinguishing each of the storage element states is then determined based on the results of the multiple read operations. One example of an implementation includes performing read operations on a first set of tracking storage elements for multiple threshold voltage levels associated with a first state, determining threshold voltage levels for the first set of tracking storage elements based on the step of performing read operations on the first set of the storage elements, performing read operations on a second set of tracking storage elements for multiple threshold voltage levels associated with a second state, determining threshold voltage levels for the second set of tracking storage elements based on the step of performing read operations on the second set of tracking storage elements, and modifying existing read compare values based on the determined threshold voltage levels for the first and the second states, with the first state and the second state not being adjacent to each other.

The various read operations can be in response to a host device requesting data or as part of an internal operation (e.g. copy data to another location, garbage collection, etc.).

One implementation of the present invention includes a set of storage elements and a controller circuit. The storage elements include multi-state data storage elements and tracking storage elements. The tracking storage elements use a subset of the multiple states used by the data storage elements. The controller circuit is in communication with the tracking storage elements and is capable of causing a performance of the functions described herein. The memory system can be an EEPROM memory system, a flash memory system or other suitable types of memory systems. In one implementation, the controller circuit includes customized hardware for accomplishing the described functions. In another implementation, the controller is programmed to perform the described functions. For example, software/firmware can be stored on one or more processor readable storage media (e.g., flash memory, EEPROM, DRAM, and other mediums) in order to program the controller.

In one exemplar implementation, the data storage elements utilize eight threshold voltage states (state 0, state 1, state 2, state 3, state 4, state 5, state 6 and state 7) and the tracking storage elements use states 1 and state 6. Tracking storage elements are grouped as pairs to establish a bit of a rotation code. Three bits establish the rotation code. Multiple sets of three pairs (e.g. four sets) can be used for redundancy.

These and other objects and advantages of the present invention will appear more clearly from the following description in which the preferred embodiment of the invention has been set forth in conjunction with the drawings.

BRIEF DESCRIPTION OF THE DRAWINGS

FIG. 5 is a table providing example voltages for one way to operate the memory cells.

FIG. 6 depicts a state space for one embodiment of the present invention.

FIG. 7 depicts an example of logical state assignments.

FIG. 8 depicts an example of physical to logical state assignment for different rotation encoding schemes.

FIG. 9 is a data map depicting user data and overhead data associated with one embodiment of the present invention.

FIG. 10 describes an example of assignments of tracking cell data patterns to rotation schemes.

DETAILED DESCRIPTION

I. Memory System

Figure 1:
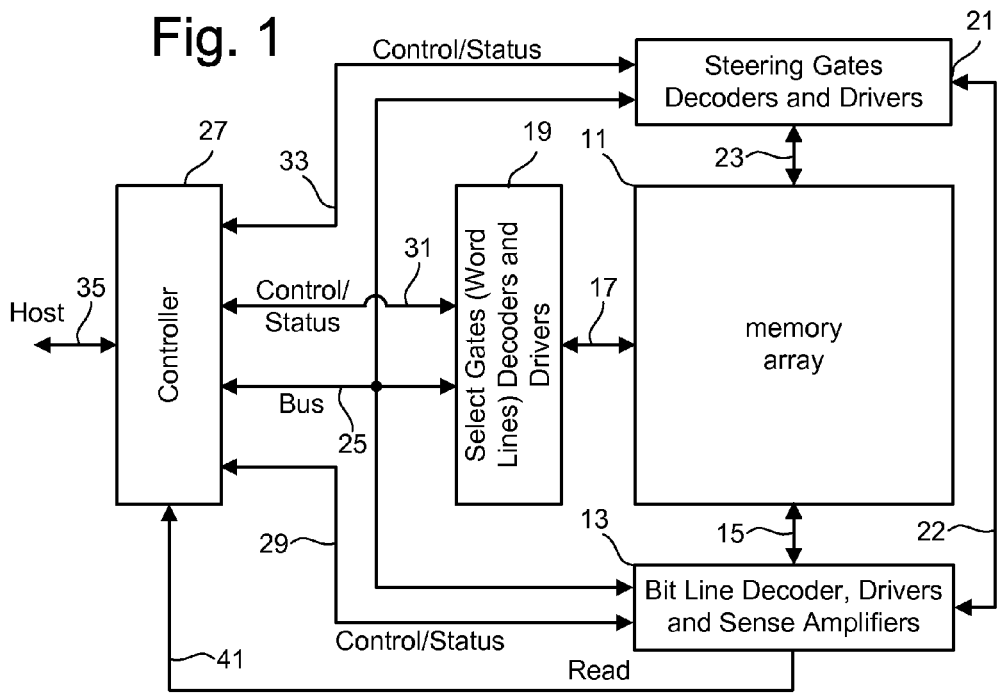
FIG. 1 is a block diagram of a flash memory system utilizing one embodiment of the present invention.

An example memory system incorporating the various aspects of the present invention is generally illustrated in the block diagram of FIG. 1. Architectures other than that of FIG. 1 can also be used with the present invention. A large number of individually addressable memory cells 11 are arranged in an array of rows and columns. Bit lines, which extend along columns of array 11, are electrically connected with bit line decoder, driver and sense amplifiers circuit 13 through lines 15. Word lines, which extend along rows of array 11, are electrically connected through lines 17 to word line decoders and drivers circuit 19. Steering gates, which extend along columns of memory cells in array 11, are electrically connected to steering gate decoders and drivers circuit 21 through lines 23. Each of the circuits 13, 19 and 21 receives addresses from controller 27 via bus 25. The decoder and driving circuits 13, 19 and 21 are also connected to controller 27 over respective control and status signal lines 29, 31 and 33. Voltages applied to the steering gates and bit lines are coordinated through bus 22 that interconnects the controller and driver circuits 13 and 21.

Controller 27 is connectable through lines 35 to a host device (not shown). The host may be a personal computer, notebook computer, handheld device, digital camera, audio player, cellular telephone or various other devices. The memory system of FIG. 1 can be implemented in a card according to one of several existing physical and electrical standards, such as one from the PCMCIA, the CompactFlash™ Association, the MMC™ Association, Smart Media, Secure Digital™, Memory Stick and others. When in a card format, the lines 35 terminate in a connector on the card which interfaces with a complementary connector of the host device. Alternatively, the memory system of FIG. 1 can be embedded in the host device. In yet another alternative, controller 27 can be embedded in the host device while the other components of the memory system are on a removable card. In other embodiments, the memory system can be in packaging other than a card. For example, the memory system can be in one or more integrated circuits, or one or more circuit boards or other packages.

Decoder and driver circuits 13, 19 and 21 generate appropriate voltages in their respective lines of array 11, as addressed over the bus 25, according to control signals in respective control and status lines 29, 31 and 33 to execute programming, reading and erasing functions. Status signals, including voltage levels and other array parameters, are provided by array 11 to controller 27 over the same control and status lines 29, 31 and 33. A plurality of sense amplifiers within the circuit 13 receive current or voltage levels that are indicative of the states of addressed memory cells within array 11. The sense amplifiers provide controller 27 with information about the states of the memory cells over lines 41 during a read operation. A large number of sense amplifiers are usually used in order to be able to read the states of a large number of memory cells in parallel.

II. Memory Cell

Figure 2:
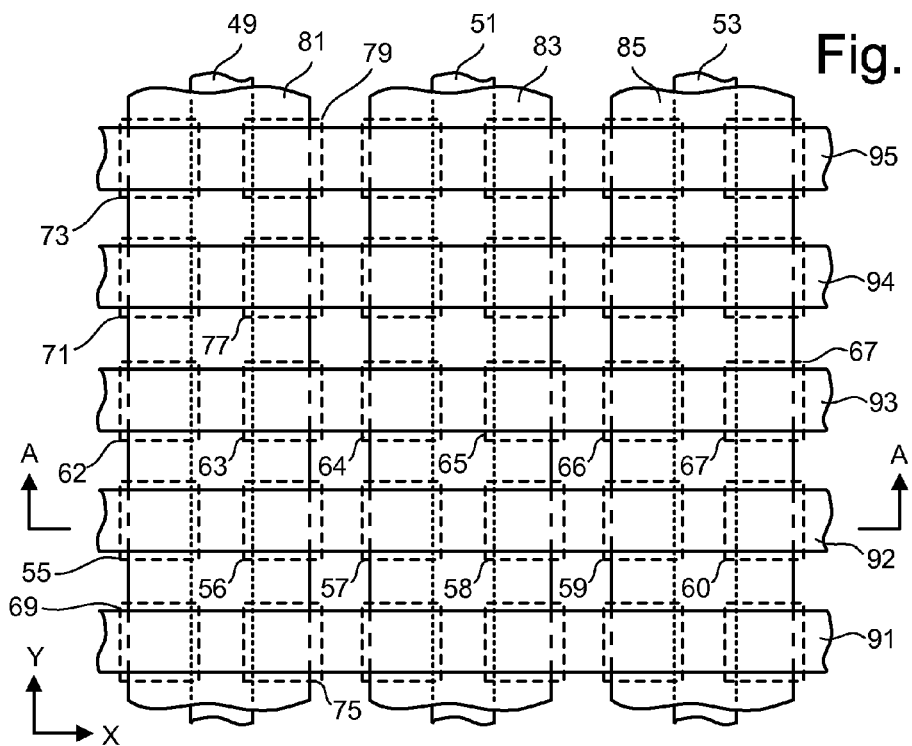
FIG. 2 is a plan view of one embodiment of a portion of the memory cell array of the system of FIG. 1.
Figure 3:
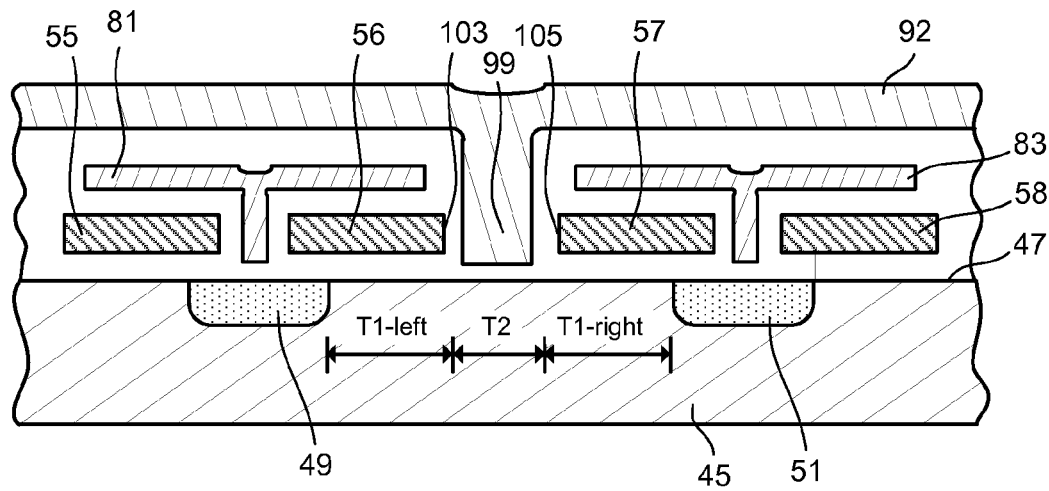
FIG. 3 is a partial cross-sectional view of the memory cell array of FIG. 2 taken at section A-A.

FIG. 2 is a plan view of a first embodiment of a portion of memory array 11. FIG. 3 is a partial cross-sectional view of the memory array taken at Section A-A. The substrate and conductive elements are illustrated with little detail of dielectric layers that exist therebetween. This simplifies the figures, however, it will be understood that appropriate oxide layers are to be included between the conductive layers themselves, and the conductive layers and the substrate.

A silicon substrate 45 includes a planar top surface 47. Elongated diffusions 49, 51 and 53 are formed into the substrate 45 through the surface 47 by an initial ion implantation and subsequent diffusion. Elongated diffusions 49, 51 and 53 serve as sources and drains of the memory cells. In order to provide a convention for this description, the diffusions are shown to be spaced apart in a first "x" direction, with lengths extending in a second "y" direction. These "x" and "y" directions are essentially orthogonal with each other. A number of floating gates are included across the substrate surface 47, with suitable gate dielectric therebetween, in an array of rows and columns. One row of floating gates 55, 56, 57, 58, 59, 60 is adjacent to and parallel with another row of floating gates 62, 63, 64, 65, 66, 67. A column of floating gates 69, 55, 62, 71 and 73 is adjacent to and parallel with a column of floating gates 75, 56, 63, 77 and 79. The floating gates are formed from a first layer of conductively doped polycrystalline silicon ("polysilicon") that is deposited over the surface and then separated by etching using one or more masking steps into the individual floating gates.

Bit line decoder and driver circuit 13 (See FIG. 1) is connected through lines 15 with all of the bit line source/drain diffusions of the array, including the diffusions 49, 51 and 53 of FIGS. 2 and 3. The sources and drains of columns of individual memory cells are connected to proper operating voltages for either reading or programming in response to addresses supplied over bus 25 and control signals over the lines 29.

The structure of FIGS. 2 and 3 uses one steering gate for every two columns of floating gates. Steering gates 81, 83 and 85 are elongated in the "y" direction and have a width in the "x" direction that extends across two adjacent columns of floating gates and a source/drain diffusion that is positioned in between them. The space between any two of the steering gates is at least as great as the space in the "x" direction between adjacent columns of floating gates that are overlaid by the two steering gates, in order to allow a gate to be later formed at the substrate in this space. The steering gates are formed by etching a second layer of conductively doped polysilicon that is deposited over the entire surface over the first polysilicon layer and an appropriate inter-polysilicon layer dielectric. Steering gate decoder and driver circuit 21 (see FIG. 1) connects though lines 23 to all the steering gates and is able to individually control their voltages in response to addresses provided on the bus 25, control signals on the lines 33, and data from drivers and sense amplifiers 13.

Word lines 91, 92, 93, 94 and 95 of FIGS. 2 and 3 are elongated in the "x" direction and extend over the steering gates with spaces between them in the "y"-direction that places each word line in alignment with a row of floating gates. The word lines are formed by etching a third layer of conductively doped polysilicon that is deposited over the entire surface on top of a dielectric that is first formed over the second polysilicon layer and regions exposed between the steering gates. The word lines allow selection of all the memory cells in its row for reading or writing. Select gate decoder and driver circuit 19 (see FIG. 1) is connected with each word line in order to individually select one row of the memory array. Individual cells within a selected row are then enabled for reading or writing by the bit line and steering gate decoder and driver circuits 13 and 21 (see FIG. 1).

Although the gates in the foregoing structure are preferably made of doped polysilicon material, other suitable electrically conductive materials may be used in place of one or more of the three polysilicon layers described. The third layer, for example, from which the word lines and select gates are formed, may be a polycide material, which is polysilicon with a conductive refractory metal silicide on its top, such as tungsten, in order to increase its conductivity. Polycides are generally not used in place of either the first or second polysilicon layers because the quality of inter-polycrystalline-silicon oxides formed from a polycide is usually not satisfactory.

Not shown in FIGS. 2 and 3 are the metal conductor layers. Since the diffusions and polysilicon elements usually have a conductivity that is significantly less than that of metal, metal conductors are included in separate layers with connections made to respective metal lines through any intermediate layers at periodical intervals along the lengths of the polysilicon elements and diffusions. Since all of the diffusions and polysilicon elements of the embodiment of FIGS. 2-3 need to be separately driven, there is typically a one-to-one correspondence between the number of these metal lines and the number of diffusions and polysilicon elements.

Figure 4:
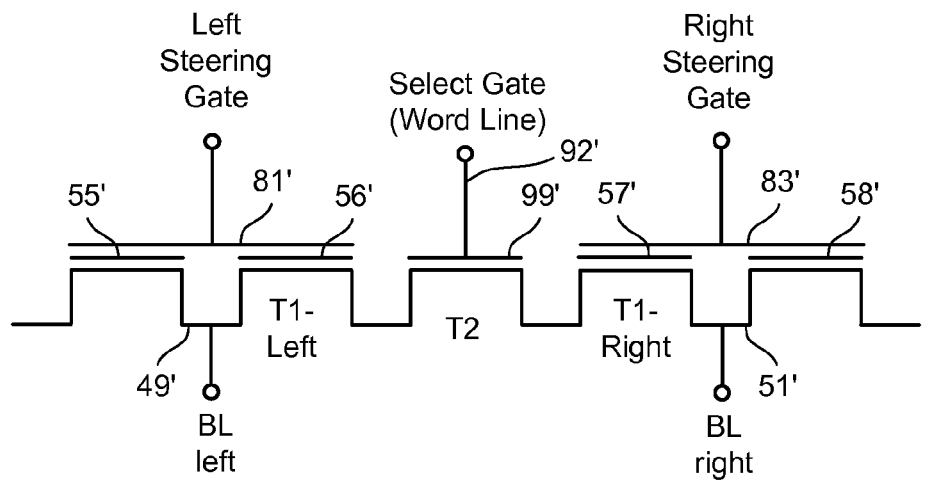
FIG. 4 is an electrical equivalent circuit to the structure of FIG. 3.

FIG. 4 depicts an electrically equivalent circuit to the structure of FIG. 3, where equivalent elements are identified by the same reference numbers as in FIGS. 2 and 3, but with a prime (') added. The illustrated structure shares the source and drain diffusions with a neighboring structure. Conduction through the channel in the substrate between the adjacent diffusions 49 and 51 is controlled by different gate elements in three different regions. A first region to the left (T1-left) has the floating gate 56 immediately above it and the steering gate 81 capacitively coupled with it. A second region to the right (T1-right) is controlled in a similar manner by the floating gate 57 and the steering gate 83. A third region T2, between T1-left and T1-right, is controlled by select gate 99 that is part of word line 92.

The level of conduction of electrons through the channel between diffusions 49 and 51 is thus affected by the electric fields imparted by these different gate elements to their respective channel regions by the voltages placed on the gates. The voltage on a floating gate is dependent upon the level of net electrical charge it carries plus all displacement charge that is capacitively coupled from other gates and nodes. The level of conduction that is permitted through the channel portion under a floating gate is controlled by the voltage on that floating gate. The voltage on select gate 99 simply turns the channel on and off to any conduction in order to select individual cells for connection with their source/ drain regions. In one embodiment, an individual memory cell can be considered as a series connection of three transistors, one for each of the three different regions (T1-left, T2, T1-Right) of the channel. In other embodiments, each floating gate can be considered a memory cell.

One of the two floating gates of a single memory cell is selected for programming or reading by placing a voltage on the steering gate above the other (non-selected) floating gate of the cell that is sufficient to cause the channel region under the other floating gate to become adequately conductive no matter what charge (which is related to its state) is carried by that other floating gate. When that cell's select transistor is turned on by a sufficient voltage applied to its word line, it is only the selected floating gate that responds to reading or programming operations directed to the cell. During a reading of the state of the one floating gate, current through the cell between its source and drain is then dependent upon the charge carried by the selected floating gate without regard to the charge on the other floating gate. Although the voltage placed on the steering gate over the non-selected floating gate to render the channel portion under the non-selected floating gate conductive is also coupled to an adjacent floating gate of an adjacent cell through the same steering gate, impact on the adjacent cell is avoided by placing proper voltage conditions on the other elements of the adjacent cell.

The floating gates of the embodiment of FIGS. 2-4 are preferably programmed by placing voltages on its bit lines (source and drain diffusions) and its two steering gates that cause electrons to obtain enough energy in the substrate channel region to be injected across the gate dielectric onto the selected floating gate. A preferred technique for this is "source side injection," described in the U.S. Pat. Nos. 5,313,421 and 5,712,180, both of which are incorporated herein by reference in their entirety.

In order to erase the memory cells of the embodiment of FIGS. 2-4, they may be designed and operated so that electrons are removed from the selected floating gates to either the channel or the select gate of the word line. If erased to the select gate, the dielectric between floating gate edge 103 and select gate 99 is preferably a thin layer of oxide that has been grown on the floating gate edge and through which electrons tunnel when appropriate voltages are placed on the various elements of the cell. The same is provided between floating gate edge 105 and select gate 99. When designed to be erased to select gate 99, care is taken to make sure that a resulting voltage gradient across the gate dielectric between the select gate and substrate surface 47 remains sufficiently below a breakdown level of that dielectric. This is a concern because the word line is typically raised to a level in excess of 10 volts and sometimes to 20 volts or more during erase, while other voltages applied to the cell are usually 5 volts or less. The voltage gradient across the select gate dielectric can be reduced by making it thicker or selected to have a dielectric constant that is higher than normally used but that can adversely affect operation of the select transistor.

If the cells are to be erased to the channel, the embodiment of FIGS. 2-4 is modified somewhat. First, the dielectric between select gate 99 and the adjacent floating gate edges 103 and 105 is made to be thicker to prevent erasing of the floating gates to the select gate. Second, the thickness of the gate dielectric between an underside of the floating gates and the substrate surface 47 is made thinner, such as about 100 Angstroms, to facilitate electrons tunneling through it. Third, the cells to be simultaneously erased as a block are grouped together along columns or within blocks. In one embodiment, a block is isolated on the substrate from other blocks. This is typically done by a triple well process, where an n-well is formed in a p-substrate, and a p-well carrying the block of cells is positioned within the n-well that isolates the block from others. An appropriate erase voltage is then applied to the p-wells of the blocks to be erased, while other blocks are not affected.

More details about the structures of FIGS. 1-5 can be found in U.S. Pat. No. 6,151,248, which is incorporated herein by reference in its entirety. The memory structure of FIGS. 2-4 is one example of a suitable memory cell. Other structures can also be used to implement the present invention. For example, one embodiment can use a multi-layer dielectric that includes a charge storing dielectric.

III. Memory Array Operation

Example operating voltages to program, read and erase the memory cells of array 11 are provided in the table of FIG. 5. Line (2) pertains to the operation of the type of cells that are erased to the select gates (word lines), while line (8) shows a modification for operating the type of cells that are erased to the substrate. In these examples, the substrate portion in which the cells are formed contains p-type doping and the bit line diffusions are of n-type. The substrate is held at ground potential throughout these operations.

In line (1) of the FIG. 5 table, the voltage conditions are given for a row that is not selected. The word line of an unselected row is placed at ground potential by driver circuit 19 (FIG. 1). The "X" in the columns for the bit lines (diffusions) and steering gates of cells along an unselected row indicates that the voltages on those elements do not matter—a "don't care" situation. Since there are no negative voltages generated by any of the circuits 13, 19 and 21 for elements of the array, in this example, a zero voltage on the select gates of a row assures that none of the cells along that row are enabled. No current can flow through their channels. Programming or reading of other cells in the same columns of a different row can take place without affecting the row having a zero voltage on its word line.

The second line (2) of the table provides an example set of voltages for erasing the type of cells designed to be erased to the word line's select gate. A high erase voltage $V_E$ in a range of 10-25 volts (e.g. 20 volts) is applied by driver circuits 19 to all the word lines whose floating gates are to be erased. This is usually at least one defined block of cells including all cells in a large number of contiguous rows. However, in applications where it is preferred, fewer or more cells may be simultaneously erased. The erase block can, alternatively, even be limited to a single row of cells. The steering gates of the cells along the one or more selected rows are set to a low voltage by the driving circuit 21 (e.g., zero volts) in order to maintain, by the high degree of capacitive coupling between the steering and floating gates, the voltage of the floating gates at a low level. The resulting potential difference between the floating gates and their respective select gates (word lines) causes electron tunneling through the intermediate dielectric. More information about erasing is found in U.S. Pat. No. 5,270,979, incorporated herein by reference.

Lines (3) and (4) in the table of FIG. 5 provide example voltages for reading the state of the two floating gates of a memory cell: line (3) for the left floating gate and line (4) for the right floating gate. In each case, the cell is enabled by the select gate being raised to a voltage $V_{SR}$ sufficient to turn on the cell's select transistor to enable current to flow through the channel. This voltage is typically one volt higher than the threshold of the select transistor.

When reading the voltage state of one floating gate, the steering gate over the floating gate being read has a voltage $V_M$ applied to it and the steering gate over the other floating gate is raised to $V_{BR}$, as shown in lines (3) and (4) of the table of FIG. 5. The voltage $V_{BR}$ is made to be high enough (e.g., 8 volts) to render the cell's channel portion under the non-selected floating gate sufficiently conductive, no matter what the programmed state of the non-selected floating gate. To read the state of the selected floating gate, the voltage $V_M$ is stepped through multiple voltages (described below) during the reading step, and its value when the cell current passes through a defined threshold is detected by the sense amplifiers within circuit 13.

Example voltages for programming one floating gate of a dual floating gate cell are given in lines (5) and (6) of the table of FIG. 5. In order to select the cell for operation, the select gate is raised sufficiently to turn on the cell's select transistor. The voltage $V_{SP}$ may be different from the voltage $V_{SR}$ used during reading in order to optimize the source side injection programming speed. An example is $V_{SP}$=2.2 volts when the threshold of the select transistor is one volt. The bit line diffusion on the same side of the cell as the floating gate selected to be programmed is raised to a maximum bit line voltage (e.g., 5 volts) during the programming operation. This voltage is made high enough to enable a sufficient field to be built up across the gap between the floating and select gate channels to obtain source side hot electron programming. The bit line diffusion on the same side of the cell as the non-selected floating gate is biased at or near zero volts during programming.

The steering gate over the non-selected floating gate is raised to a voltage $V_{BP}$ that is sufficient to render the channel region under the non-selected floating gate sufficiently conductive (e.g. $V_{BP}$=8 volts) in order to pose no interference to programming of the target floating gate, regardless of what floating gate voltage exists on the non-selected floating gate, within a programming window range of floating gate voltages. A voltage $V_P$ is applied to the steering gate over the selected floating gate with a level that drives the selected floating gate to a voltage that assists in creating the desired field conditions in the channel below it for hot electron programming. For example, the voltage $V_P$ can be within the range of 5-12 volts. This voltage may vary during the programming operation. Typically, the appropriate set of programming voltages is first applied to an erased cell, followed by the appropriate set of reading voltages, and, if the reading step does not indicate that the selected floating gate has been programmed to the desired voltage state, which may be the programming state for binary storage or one of the variable storage states for multi-level storage, programming voltages are again applied which may in part be different from the earlier set.

Line (7) of the table of FIG. 5 shows voltages that are applied to those cells within a row selected for programming that are themselves not to be programmed. For example, the number of cells programmed at the same time within one row of a segmented portion of an array are spaced alternately along the row with other cells in between them that are not being programmed. It is these other cells not being programmed that receive the voltages of line (7) of the table of FIG. 5. The opposing bit line diffusions are maintained at the same voltage in order to prevent any current from flowing in the channel (e.g., both at zero or both at 5 volts). As with the notation used in line (1), the "x" indicates that the voltages on the steering gates of these cells are a don't care.

In the case of memory arrays designed to be erased to the substrate, erase voltage conditions of line (8) are applied instead of those of line (2). Both the p-well containing a block of cells to be erased and its surrounding n-well are raised to the erase voltage $V_E$, within an example range of 10-25 volts (e.g. 20 volts preferred). During reading and programming such cells, their wells are held at ground potential. A positive voltage $V_{SE}$ is preferably applied to the select gates during erase in order to reduce the voltage applied across the select gate dielectric, since an excessive voltage differential between the substrate and select gate can damage the dielectric material or cause it to be made thicker than otherwise desirable for operation of the cells. Since such a voltage is partially coupled from the select gates to the adjoining floating gates sought to be erased, it cannot be too high or else the voltage differential between the floating gates and the substrate channel, which is made high to effect the erase, is reduced too far. An example range of $V_{SE}$ is 3-12 volts, depending upon the level of $V_E$. $V_{SE}$=10 volts is preferred when $V_E$=20 volts.

The values provided in FIG. 5 are one set of examples. Those skilled in the art will be able to use other suitable values and methodologies for operating the memory system.

IV. Tracking Cells

As described above, the floating gates can store multiple levels or ranges of charge, therefore, providing for multiple states. In one example, a floating gate stores eight target ranges of charge; therefore, providing for eight states. Such floating gate stores three bits of data. FIG. 6 graphically depicts an exemplar state space for a floating gate that can store eight states. FIG. 6 shows eight physical states: P0, P1, P2, P3, P4, P5, P6 and P7. For example purposes, the vertical axis in FIG. 6 is for threshold voltage in millivolts. However, depending on the implementation, other units may be used. For each of the physical states, FIG. 6 shows the range or distribution of threshold voltage levels, represented by a bell shaped curve. The top (or right most point) of the bell curve is typically the center of the state. For example, state P1 has the center of the state at 1,000 mV, a lower boundary at 800 mV and an upper boundary at 1,200 mV. The areas between the states are known as state-to-state threshold margins. There are seven threshold margins, one between each of the sets of neighboring states. For example, there is a threshold margin between neighboring states P1 and P2. Note that FIG. 6 shows states P1-P7 as being positive voltages while P0 includes negative voltages. In other embodiments, more or fewer states can be positive or negative. In addition, the voltage range from 0 to 4,900 mV can be different in various embodiments due to the particular characteristics and conditions of the memory array.

A floating gate storing eight states can store three bits worth of data. Thus, there are eight logical states. In one embodiment, these logical states are assigned to the physical states using a gray code assignment so that if the threshold voltage of a floating gate erroneously shifts to its neighboring physical state, only one bit will be affected. FIG. 7 provides a table depicting a gray code example assignment of the binary data to logical states. In other embodiments, a non-gray code assignment can also be used. Each logical state is assigned to a physical state. However, the assignment of logical states to physical states can be rotated. FIG. 8 is a table showing eight different rotation schemes for the assignment of logical states to physical states. For example, in rotation 0, physical state P0 stores logical state L0 (e.g. binary data 000), physical state P1 stores logical state L1 (e.g. binary data 001), etc. In rotation 1, physical P0 stores logical state L7 (e.g. binary 100), physical state P1 stores logical L0 (e.g. binary data 000), etc. Thus, there are eight different rotation schemes that can be used when programming. In one embodiment of the present invention, each time a sector is programmed, that sector will first be erased and then programmed with one of the eight rotation schemes. In subsequent program/erase cycles the sector will be programmed with a different rotation scheme.

In one implementation, the memory device will cycle through the rotation states sequentially. In another embodiment, the memory device will randomly (or pseudo-randomly) choose a rotation scheme for each program cycle. Rotating the data, promotes the maintaining, over repeated program-erase cycling, of uniform stress conditions for all cells in a sector, independent of the actual data pattern being programmed into the sector. In regard to the rotation of data, note that in one embodiment the same post-erase rotation can be propagated to all sectors for a given erase-block since all those sectors operate in history-unison. Note also that if intra-sector wear leveling is inadequate, some form of forced programmed intra-sector wear leveling may be required (e.g. occasional programming to some force level or logical data pattern).

In one implementation, memory array 11 is broken up into sectors. One embodiment of how a sector is broken down is depicted in FIG. 9. The sector includes user data 250 and ECC data 252. The sector typically consists of a subset of cells on one word line, capable of storing 512 bytes of user data. Other definitions of a sector can also be used with the present invention. The sector also includes tracking cells 254 and header information 256 (not directly dictated by the user). The header information includes address information, bit and/or sector mapping related information and counts of the number of writes to the sector. Other information can also be stored in the header. Examples of tracking cells can be found in U.S. Pat. Nos. 5,172,338, 6,222,762, and 6,538,922; all of which are incorporated herein by reference in their entirety. The tracking cells are used to reliably establish optimal discrimination points for each of the various states of charge in the floating gates. In the embodiment depicted in FIG. 9, the sector includes 24 tracking cells. The tracking cells are grouped into pairs and three pairs are then grouped into a set. In one embodiment, each pair includes a pair of floating gates within the same sector, with floating gates as described above with respect to FIGS. 2-4. FIG. 9 shows four sets of tracking cells: set 260, set 262, set 264 and set 266. In one embodiment, the sets are redundant copies of the same information.

In one embodiment, the tracking cells only store data in either of two states. For example, FIG. 9 shows each tracking cell storing data in physical state P1 or physical state P6. In other embodiments, other states can be used. In many embodiments, less than all of the states are used. For example, FIG. 6 shows a memory state space with eight states. Thus, the present invention will use less than eight states for the tracking cells. One advantage of using a subset of states is that the states that are used (the tracking cell states) can be separated with one or more states between them. The consideration for selecting states P1 and P6 are that they are separated as far as possible in threshold voltage level to give the largest baseline while avoiding the two end states (state P0 and state P7) which may have different threshold voltage distribution statistics because of different associated operating conditions or requirements. For example, state P0 may follow statistics of the erase operation, as opposed to that of data programming. The potential for relaxed margins in the case of the most heavily programmed state (state P7) could result in differences/offsets in distribution relative to the intermediate states P1-P6. FIG. 6 illustrates the voltage threshold distributions for the states as bell curves. The corresponding tracking cell distributions are depicted by the narrower bell-shaped curves 200 and 202. Because of the large threshold voltage delta separating states P1 and P6, it will be highly improbable for a sufficient number of tracking cells to be mis-detected (interchanging a higher threshold voltage range for a lower and/or vice versa), without the data portion being massively corrupted as well.

In embodiments with a number of states other than eight, the tracking cells may use different states to store data. For example, in a device with four states (e.g. P0, P1, P2, P3), the tracking cells may store data in states P1 and P3. In an embodiment with a device having sixteen states (P0, P1, P2, ..., P14, P15), the tracking cells may store data in states P1 and P14. Other states can also be used instead of or in addition to the states noted above.

One question that arises is where should the corresponding tracking cells be placed within the data stream. Keeping them at the tail end eliminates a need to shift them out on an ongoing basis, which potentially saves a small amount of time during read but potentially requires shifting out the entire sector of data to read the tracking information when needed. This also tends to physically bunch up the tracking cells in a localized area of the sector, making it vulnerable to localized variation. Physically disbursing the tracking cells throughout the sector improves the ability to reflect local variations within a sector, but is cumbersome to manage and use. As with the tail end case, placing the tracking cells at the front end will also tend to physically bunch them, and they will be included in the read pass for every read operation, whether needed or not. However, in one embodiment, the tracking cells are also used for encoding the data rotation state. When using the tracking cells to encode the data rotation, the tracking cells should be read during each read process. Therefore, it makes sense to put them at the front of the data stream, as depicted in FIG. 9. Note that it is possible to both uniformly disperse these tracking cells physically within the sector while still providing front end tracking cell reading by architecting the array decoding to reflect such an embodiment.

Each of the tracking cells stores data in either state P1 or P6. That is, the threshold voltage level is placed at either P1 or P6. When pairing up to adjacent cells (e.g. in one embodiment, adjacent floating gates), they are programmed so that one of the pair is in state P1 and the other of the pair is in state P6. As such, the pair can either have two orientations: 16 or 61. When the pair is at 16, then the pair is considered to be logic 0. When the pair is at 61, the pair is considered to be logic 1. Thus, a pair of tracking cells is used to form a bit of rotation encoding data (either 0 or 1). A set of three pairs forms three bits of rotation encoding data suitable for storing an indication of one of eight possible rotation schemes. For example, set 260 includes three bits of rotation encoding data. The first bit in set 260 is 16, which is logic 0; the second bit in set 260 is 61, which is logic 1; and the third bit in set 260 is 16, which is logic 0. Therefore, set 260 stores the code 010 (decimal value of 2 or rotation 2). In other embodiments, more or less than eight rotations can be used and, therefore, the code identifying the rotation scheme can be formed by more than or less than three bits (e.g., two bits, five bits, etc.) and more than or less than six tracking cells and/or floating gates. In one implementation, the floating gates can store 16 levels/states and 4 (or a different number) of rotation bits are used. In one embodiment, each of the sets are redundant of each other. By using redundancy, individual errors in the tracking cells can be remedied. Thus, sets 262, 264 and 266 all store 010. The three bits and six tracking cells within a particular set are not redundant of each other since all three bits (and associated six cells) are needed to identify the code for the rotation scheme.

The three bits stored by each set represents a code indicating a particular rotation scheme. As discussed above, FIG. 8 depicts the eight various rotation schemes in one embodiment of the present invention. FIG. 10 depicts how the various codes stored within the sets 260, 262, 264 and 266 are assigned to each of the rotation states. Thus, a data pattern of 161616 corresponds to rotation 0, 161661 corresponds to rotation encoding 1, 166116 corresponds to rotation encoding 2, 166161 corresponds to rotation encoding 3, 611616 corresponds to rotation encoding 4, 611661 corresponds to rotation encoding 5, 616116 corresponds to rotation encoding 6 and 616161 corresponds to rotation encoding 7.

Figure 11:
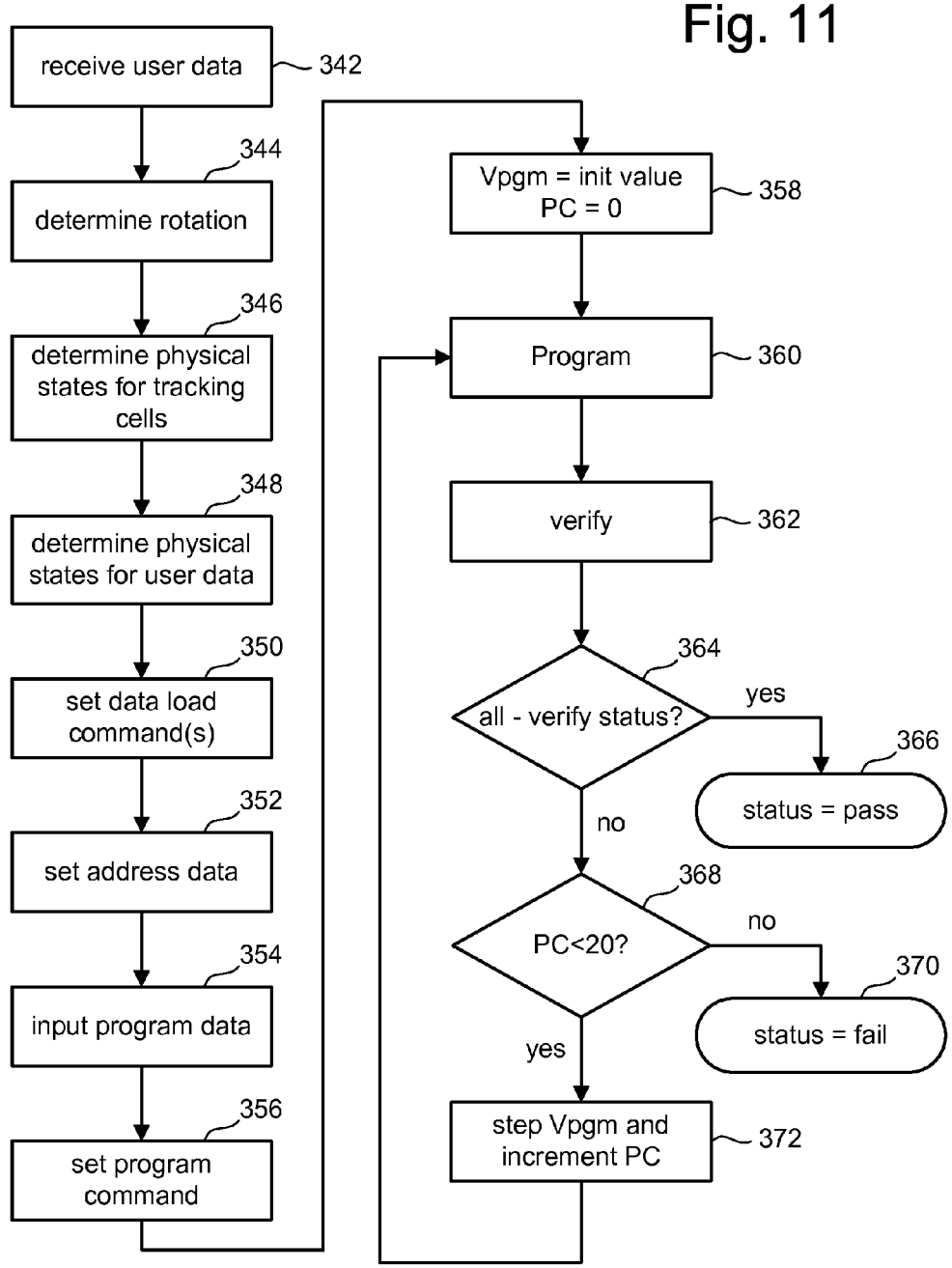
FIG. 11 is a flow chart describing one embodiment of a method for writing data.

FIG. 11 is a flowchart describing the process for programming the cells of a sector, including programming the tracking cells. The technology for programming an individual cell has been described above. FIG. 11 is a device level process. In step 342, user data is received. That is, the controller will receive data from a host system. In another instance, data to be written can be internally sourced, dictated by internal needs such as scrubbing, wear leveling or garbage collection. In step 344, the controller determines the rotation scheme to use. As discussed above, rotation schemes can be chosen sequentially, randomly, pseudo-randomly or by any other suitable scheme. In step 346, the appropriate physical states associated with the selected rotation scheme are determined for each of the tracking cells. That is, based on the rotation code (see FIG. 10), the appropriate data pattern is assigned to the sets of tracking cells. In one embodiment, the tracking cells are not rotated. In step 348, the controller determines the physical state for each data value to be programmed. That is, using the table of FIG. 8, each of the logical states for each data value is assigned to a physical state for a particular memory cell. In some embodiments, the physical states for the data is computed dynamically as the data is being transmitted to memory.

In step 350, a "data load" command is issued by the controller. In step 352, address data is provided to the appropriate decoders from the controller. In step 354, program data is input to the memory array, biasing the word lines and bit lines appropriately, the data and addresses having been latched to establish the selected bit lines, word lines and steering gates. In step 356, a "program" command is issued by the controller.

In step 360, a program operation is performed. In many embodiments, a programming voltage is divided into many pulses. The magnitude of pulses is increased with each pulse by a predetermined step size. In the periods between the pulses, verify operations are carried out. That is, the program level of each cell being programmed in parallel is read between each programming pulse to determine whether it is at least equal to its data associated verify level. For example, if the threshold voltage is being raised to 2.5 volts, then the verify process will determine whether the threshold voltage is at least 2.5 volts. Once it is determined that the threshold voltage of a given memory cell has reached or exceeded the verify level, the programming voltage is removed from that cell terminating further programming. Programming of other cells still being written to in parallel continues until they in turn reach their verify levels, whereupon their programming is terminated.

In step 358 of FIG. 11, the programming voltage (Vpgm) is initialized to the starting pulse condition and a program counter PC is initialized at 0. In step 360, the first Vpgm pulse is applied. In step 362, the threshold levels of the selected memory cells are verified. If it is detected that the target threshold voltage of a selected cell has reached its appropriate level, as determined by its associated data, then further programming for that cell is further inhibited. If it is determined that the threshold voltage has not reached the appropriate level, then programming of that cell will not be inhibited. Thus, if the all-verify status (step 364) indicates that all cells have reached their appropriate threshold level, then a status of pass will be reported in step 366. If all cells have not been verified to reach the appropriate threshold voltages, then in step 368 the program counter is checked against the program limit value. One example of a program limit value is 20. If the program counter is not less than 20, then the program process has failed and the status of "FAIL" is reported in step 370. If the program counter is less than 20, then the program voltage level is increased by the step size and the program counter is incremented in step 372. After step 372, the process loops back to step 360 to apply the next programming voltage pulse.

Figure 12:
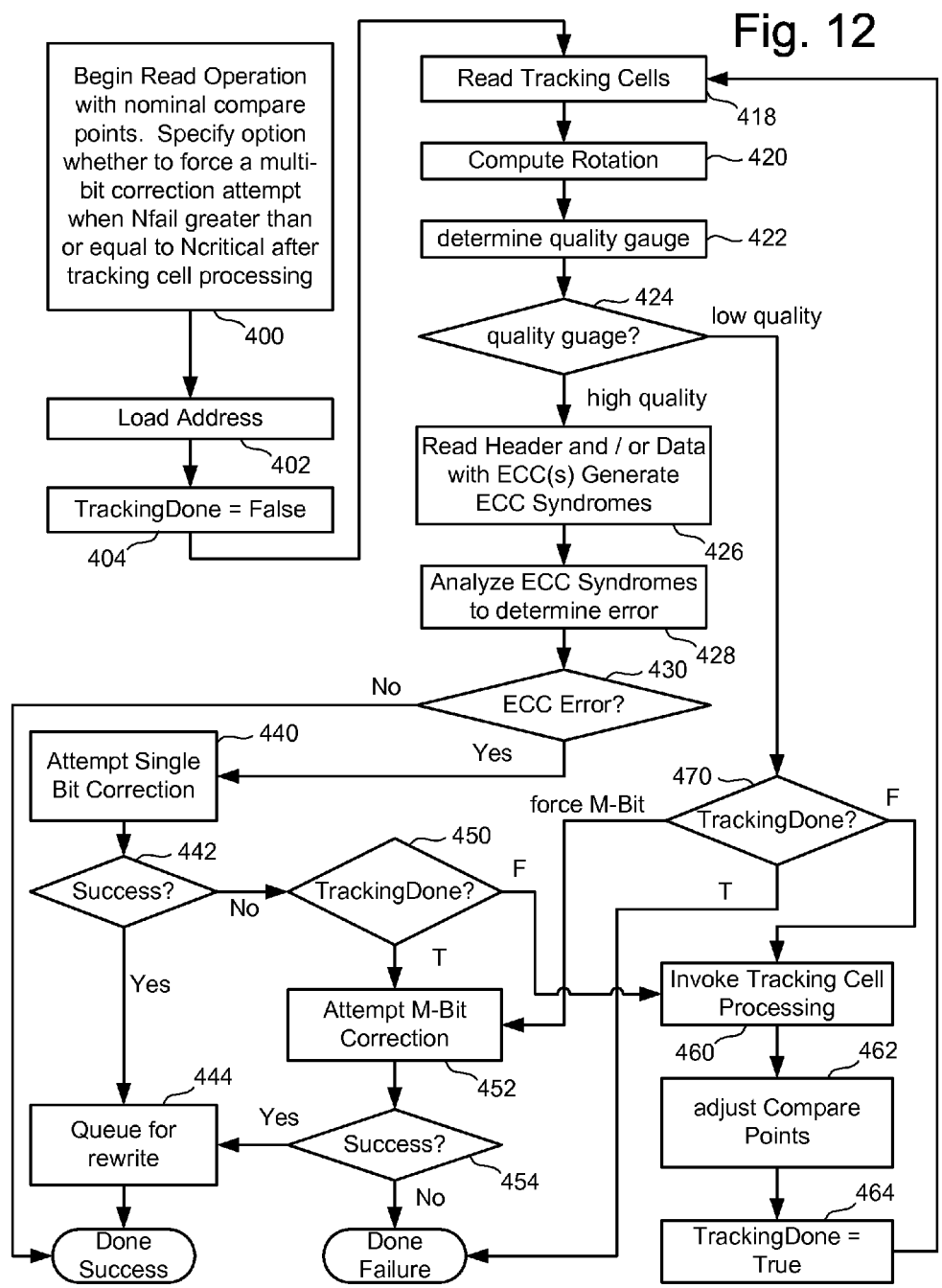
FIG. 12 is a flow chart describing one embodiment of a method for reading data.

Once programmed, memory cells of array 11 can be read according to the process of FIG. 12. In step 400, the read operation begins with normal compare points. A compare point is a voltage threshold level that is typically set midway between two voltage threshold states and is used to distinguish between the states above and below that level. For example, FIG. 6 shows compare points as heavily shaded gray lines at 700 mV; 1,300 mV; 1,900 mV; 2,500 mV; 3,100 mV; 3,700 mV and 4,300 mV. In addition, there is an option to specify whether to force a multi-bit correction attempt when the data quality is low after tracking cell processing, as will be described in more detail below. This option can be specified by the host, by the controller or preprogrammed into the memory system.

In step 402 of FIG. 12, the local address is determined. That is, the controller received or accessed a logical address (or addresses) for data to be read. These addresses are converted to physical addresses in the particular memory array or arrays. In step 404, the boolean variable TrackingDone is set to False. In step 418, the tracking cells are read. More information about reading tracking cells will be described below. In step 420, the rotation scheme is computed and in step 422 an associated quality gauge is determined (or updated). More information about computing rotation and determining/updating the quality gauge will be discussed below. In step 424, it is determined whether the data is high quality or low quality based on the quality gauge (described below). If the quality gauge indicates low quality data, then the process proceeds to step 470 (discussed below). If the quality gauge indicates high quality data, then in step 426 the user data and the error correction codes are read using the computed rotation to establish the logical data from that which has been read physically. That is, the user data is decoded according to the rotation scheme determined in step 420. According to standard methods known in the art, the controller generates ECC syndromes for the data read process. In step 428, these ECC syndromes are analyzed to determine whether there are any errors in the data. If the ECC does not find any errors (step 430), then the read process is done and is successful. The data read is reported back to the host from the controller, if the request was from the host. If the ECC process determines that an error exists (step 430), then in step 440 the controller attempts a single bit correction process. That is, using methods known to those skilled in the art, ECC is used to correct a single bit of data that is in error. If the single bit correction process is successful (step 442), then the corrected data is optionally (as set by an option bit) queued for rewrite (step 444). The read process is then considered a success, the data is reported back to the host (as needed) and the corrected data is optionally re-written to the memory array. Note that the use of ECC with reading data is well known in the art. The present invention will work with many ECC schemes known in the art.

If the single bit correction process is not successful (e.g. because there are multiple errors), then it is determined whether tracking cell processing has been done by testing the boolean variable TrackingDone in step 450. If the variable TrackingDone is set to True (that means that tracking cell processing has been completed), then the process attempts a multi-bit correction process in step 452. The present invention will work with multi-bit correction processes known in the art. If the multiple bit correction technique is successful (step 454), then the corrected data is queued for re-write, the read process is considered successful and the data read (and corrected) is returned to the host (as needed). If the multi-bit correction process is not successful (step 454), then the read process is considered a failure and treated accordingly (e.g. if the host is expecting this data, then the host receives an error message).

If in step 450, it is determined that tracking cell processing was not done (because the boolean variable TrackingDone was set at False), then the controller will perform tracking cell processing in step 460. Tracking cell processing includes processing the tracking cells to determine a new set of compare points. More information about step 460 will be described below with respect to FIG. 15. In step 462, the existing compare points will be adjusted based on the results of step 460 and the Boolean variable TrackingDone will be set to True in step 464. After step 464, the process loops back to step 418 and the system attempts to read the tracking cells and data cells again using the new compare points. Note that the new compare points can be used temporarily or permanently. Additionally, the new compare points can be used for the current sector under consideration only, or for the current sector as well as other sectors. For example, in one embodiment, if a set of sectors are treated as a group (e.g. a file) and if one sector's compare points are adjusted, then the compare points for all of the sectors in the group will be adjusted.

If the quality gauge indicates low quality data in step 424, then the process proceeds to step 470. In step 470, it is determined whether tracking cell processing has been done by testing the boolean variable TrackingDone. If TrackingDone is set to True, then the read process fails. If TrackingDone is set to False, then tracking cell processing is performed in step 460. Additionally, at step 470, a variable can be set to force the process to perform multi-but correction in step0 452.

Step 418 of FIG. 12 includes reading the tracking cells. To do so, the voltage level on the appropriate steering gate is stepped through the seven compare points, as described with respect to FIG. 6, so that seven read operations are performed. In each read operation, the voltage of the steering gate is stepped to a different level so that the tracking cell is tested at each of the compare points. At each compare point it is determined whether the particular tracking cell turned on or remained off. That is, whether current flowed or did not flow. At the end of the seven read operations, the data from the read operations is shifted to the controller. The controller then transforms that data according to the table of FIG. 13. The table in FIG. 13 indicates what state a particular memory cell is in based on data from each of the seven read operations. For example, if the memory cell turned on for all seven read operations, then the memory cell is in physical state P0. If the memory cell was off during the first pass and on during the remaining six read operations, then the memory cell is in state P1. If the memory cell was off during the first two read operations and on during the remaining read operations, then the memory cell is in state P2, and so on. As anticipated, when no error exists, each tracking cell is found either data states P1 or P6, as originally written. In other embodiments, other states can be used. Note that the read process described above uses voltage sense; however, it is understood that a current sense or other methods of reading (or sensing) are also within the scope of the invention.

Figure 14:
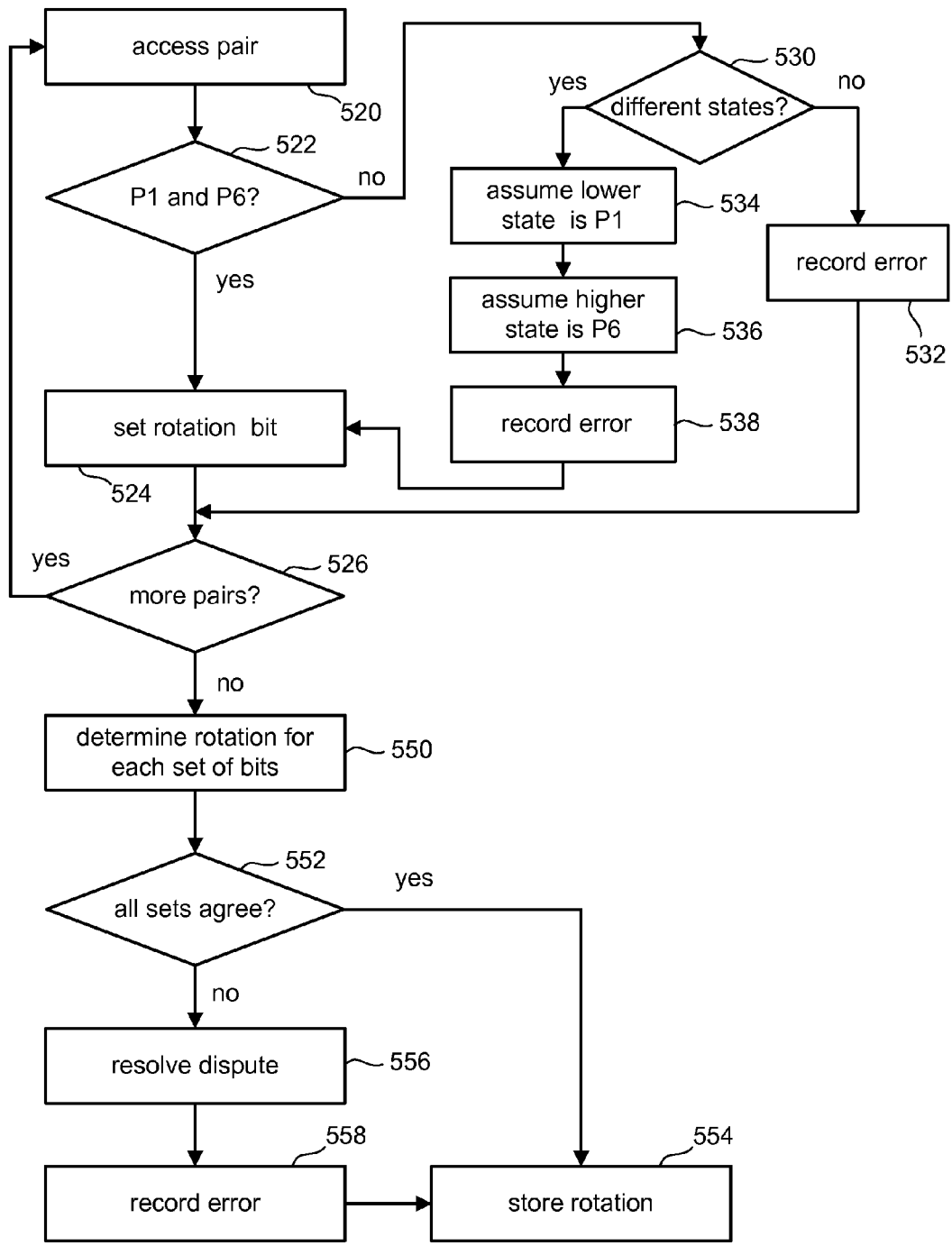
FIG. 14 is a flow chart describing one embodiment of a method for determining a rotation scheme.

FIG. 14 is flowchart describing one embodiment of a process for computing the rotation scheme (step 420 of FIG. 12). In step 520, the controller accesses data from a pair of tracking cells (in one embodiment, a pair of floating gates—e.g. see FIGS. 3-4). In step 522, its is determined whether one of the pair of tracking cells is in state P1 and the other of the pair of tracking cells is in state P6. If so, then the bit for those two tracking cells is set appropriately in step 524, as described with respect to FIG. 10. That is, if the first tracking cell is in P1 and the second tracking cell is in P6, then the corresponding rotation bit is set to 0. Alternatively, if the first is in P6 and the second is in P1, then the rotation bit is set to logic 1. In step 526, it is determined whether there are any more pairs of cells to process. If there are more pairs to process, then the method loops back to step 520. Note that in one embodiment, when making the determination that the cells are in states P1 and P6 (see step 5522), the system may accept states other than state P1 or state P6. For example, states P0, P1, P2 and P3 (or a subset of those states) may be treated as states P1 and states P4, P5, P6 and P7 (or a subset of those states) may be treated as states P6.

If in step 522 it is determined that the pair of cells does not have one cell in state P1 and the other cell in state P6, then in step 530 it is determined whether the two cells are in different states. If the two cells are in the same state, then there is an error that is recorded in step 532. Step 532 could include adding data to a progressive error measure after storing specific data for this particular comparison. The data stored in step 532 is used for the quality gauge. If the two cells are in different states, then in step 534, the controller assigns the cell with the lower threshold voltage to be in state P1 (step 534) and assigns the cell with the higher threshold voltage to be in state P6 (step 536). In step 538, the error is recorded and operation returns to step 524. Step 538 could include a recording of the number of cells that are not in states P1 or P6 and/or the delta that these particular cells deviated from state P1 and/or P6.

When there are no more pairs to process (step 526), then the system at that point will have processed 12 pairs and, thus, will have 12 bits of data. The 12 bits of data are grouped into four sets of data organized as depicted in FIG. 9. In step 550, the rotation for each set is determined by comparing the three bits to the table of FIG. 10. A rotation is separately determined for each set. The sets are then compared against each other. If all four sets have the same rotation code (step 552), then that rotation code is stored in step 554. If the four sets do not agree, then the dispute is resolved in step 556 and the resolved rotation code is then stored in step 554, after the error information is stored in step 558.

There are many ways to resolve the dispute. One way is to vote, where the majority wins. For example, if three out of four sets determined that the code was one particular value and the fourth set determined a different particular value, the dispute would be resolved by proceeding with the code chosen by the three sets. An alternative method is to match up bits to see which bit is off and then to do a vote by bits. For example, if the first two bits are the same on all four sets, but the third bit is different in one of the sets, then assume that the third bit is the value determined by the three sets with a common value. Alternatively, the results can be done by cells, where if five of the cells are the same for all of the sets and the sixth cell differs in one of the sets, ignore the one differing cell.

Another embodiment for determining the rotation is to simply do one read for each tracking cell with a compare point that is halfway between physical state P1 and physical state P6. Assume that all cells that turn on are in P1 and all cells that remain off are in P6. Where both cells of a rotation pair are resolved to be in the same state, the system can step through various intermediate comparison points with greater resolution until it finds one comparison point where one of the cells turns on and the other cells turns off.

FIG. 14 shows boxes 532, 538 and 558 where error is recorded. This error is used to create the quality gauge. Based on the data recorded in steps 532, 538 and 558, the quality gauge is determined in step 422 of FIG. 12. In one embodiment, the quality gauge measures the number of errors, the amount of error past a threshold, etc. For example, in one embodiment, the quality gauge may store an indication of the numbers of tracking cells that are not in state P1 or P6, or the quality gauge may store the cumulative or average amount that such cells differ from P1 or P6. Alternatively, the quality gauge may store multiple values, such as each of the differences from P1 and P6 for those tracking cells not in P1 or P6. Other data or measures of error may also be reflected in the quality gauge. In another embodiment, the quality gauge is set to one of a number of pre-set states based on the number or magnitude of errors. The system can use the quality gauge to trigger behavior when the quality gauge meets predefined criteria, such as being below a threshold, above a threshold or satisfying a rule/property, depending on the data measured.

Despite the forgiving capability of determining rotation in the presence of wide shifts and data states/margins, the actual states read from the tracking cells could be substantially off from the target states of P1 and P6. By determining how many cells differ from the target, one embodiment of the quality gauge is established. When this quality gauge exceeds a predetermined threshold (or progressive set of threshold values), a warning condition (or series of progressive warning conditions) can be triggered in response to the quality gauge. In one embodiment, the memory device will not perform a response to the warning condition or error gauge (e.g. it will do nothing different and the read process will continue). In other embodiments, the memory device will perform a response to the warning conditions; for example, the process can immediately move to the tracking cell processing (see step 424 of FIG. 12) to adjust the compare points and re-start the read process. Alternatively, the entire read process can be aborted (e.g. via step 470 going to the Done/Failure block). In another alternative, ECC parameters can be changed. For example, the system can choose not to do multi-bit correction if the quality gauge is above threshold. One example of a threshold that triggers a warning condition is if the number of tracking cells not in either states P1 or P6 is greater than 1. This would allow one random failing bit (e.g. due to random noise) to be passed over. However, greater than one failure would be flagged, since the likelihood of two such random, uncorrelated errors is highly improbable, indicative of a more widespread failing condition existing within the sector. In other embodiments, the threshold could be 2 (or another number of) tracking cells not in either states P1 or P6.

Figures 13, 15:
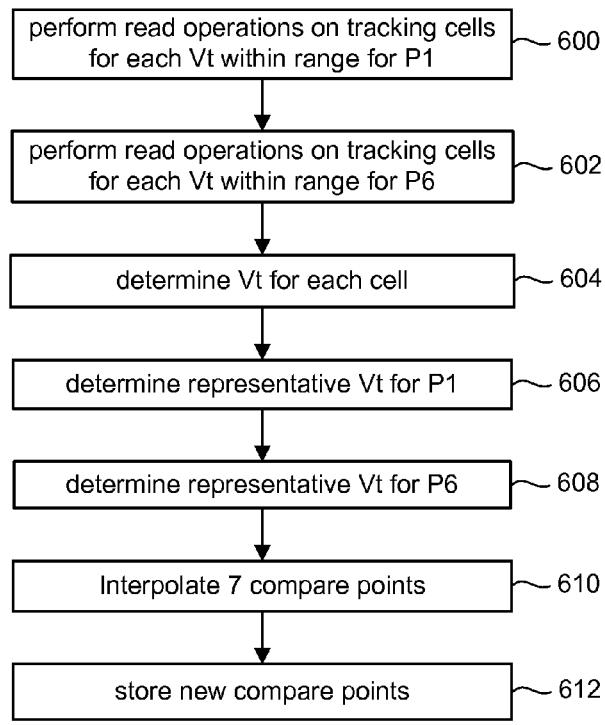
FIG. 13 is a table that can be used to determine a state of a cell during a read operation.
FIG. 15 is a flow chart describing one embodiment of a method for processing tracking cells.

FIG. 15 is a flowchart describing one embodiment of a process of performing tracking cell processing (see steps 460 and 462 of FIG. 12). In step 600, the controller will cause read operations to be performed on each of the tracking cells for each threshold voltage within a predetermined range associated with physical state P1. For example, FIG. 6 shows threshold voltages 210 which are associated with state P1. These fifteen voltages include threshold voltages inside the expected range of state P1, as well as below and above that range. In other embodiments, a greater resolution can be used so that more threshold voltages will be tested or a lesser resolution can be used testing fewer threshold voltages to save time. Other embodiments can increase or decrease the range at the resolution depicted in FIG. 6. In one embodiment, all of the tracking cells will have read operations for each of those threshold voltages. In another embodiment, only those tracking cells thought to be in P1 will have read operations performed on them for the threshold voltages associated with P1. For example, there will be 15 read operations on each tracking cell which is thought be in state P1. In another embodiment, all of the tracking cells will have read operations for each of those threshold voltages, however, those tracking cells thought not to be in P1 will have the results of the read operations discarded. In step 602, the controller will cause the performance of read operations for each of the tracking cells for each threshold voltage within a range associated with state P6. For example, FIG. 6 shows fifteen threshold voltages 212 in the range associated with state P6. Similar embodiment alternatives discussed above with respect to P1 also apply to P6. For example, a higher resolution can be achieved with more than fifteen threshold voltages and lower resolution can also be used with less than fifteen threshold voltages. In one embodiment, as with P1, every tracking cell will be subjected to fifteen read operations in step 602. In another embodiment, only those tracking cells thought to be in P6 will be read in step 602.

In step 604 of FIG. 15, the controller will determine the actual threshold voltage for each of the tracking cells based on the read operations of steps 600 and 602. The controller will look for the first threshold voltage where the cell turned on. At the end of step 604, the controller will have 24 threshold voltages, one for each of the 24 tracking cells. In step 606, the controller will determine a representative threshold voltage for state P1. In step 608, the controller will determine a representative threshold voltage for state P6. The representative threshold voltage for each of the two states can be calculated using one of a variety of well known mathematical means. For example, a distribution for each state population can be established and its mean determined. Alternatively, linear regression can be used. For simplicity, a simple average for each population can be performed. In one alternative, a simple average is calculated but outliers are rejected. Outliers can be rejected by a filtering process or simply by removing the highest and lowest threshold voltage for each of the two population (e.g., for P1 and P6).

In step 610, seven new compare points are created based on the two representative threshold voltages. These compare points are established by means of interpolation and extrapolation to arrive at a best estimate of the optimum compare points. There are many means for determining the compare points. In one example, the controller can determine the increase in representative threshold voltage for states P1 and P6, average those two numbers to determine an average increase and then raise the existing compare points by that average increase. For example, if it is determined that the representative threshold voltage for states P1 and P6 increased by average increase of 100 mV, then the default set of compare points (700, 1300, 1900, 2500, 3100, 3700, 4300 and 4900) will be adjusted by raising them 100 mV to new levels (800, 1400, 2000, 2600, 3200, 3800, 4400 and 5000) and the data be read against these new compare points. In another embodiment, the system can evaluate the representative threshold voltages for each of the eight states, determine a relationship among those eight representative threshold voltages, insert the new values for states P1 and P6 into that relationship to determine new threshold voltages for each of the eight states. With the new threshold voltages, new compare points can be calculated between the states, by establishing the closest read voltage levels to the midpoints between adjacent states. Alternatively, a relationship can be determined between the compare points and the representative threshold voltages of states P1 and P6 so that plugging in new values for the representative threshold voltages for P1 and P6 changes the compare points. Other algorithms can also be used.

In one embodiment, the new compare points are not used exclusively for the failing read sector that had just triggered the tracking cell processing, but also for subsequent reads as well (e.g. reads to other locations in the same memory during the same read or a future read session, which may or may not require the same corrections). In such a scenario, the compare points of choice will be the corrected values in place of the original reference values. Alternatively, two sets of conditions, one using default values and the other using the most recently established corrected values, can be concurrently maintained by two reference set of registers and associated read modes. On read failure with one mode, re-read can be implemented using the other read mode/reference conditions as the first step in attempting data recovery. The mode to be attempted first can be optimally established based on likely success (e.g., either statistically based on characterization, or dynamically based on success history). Note that the above process describes fifteen steps during the tracking cell processing. Other embodiments use more or less than fifteen steps; for example, the process can use 20 steps with a 25 mV-volt resolution and 500 mV state-to-state separation. In one embodiment, the tracking cell processing would only be performed if the quality gauge indicated low quality data or if the ECC failed.

Note that in one embodiment the system can independently read out a header or header stack (e.g. in preparation for an internal data copy operation) where the user data portion must be transferred intact within the memory. In such a situation, prior to rewriting the user data (e.g. copy it elsewhere), it is necessary to first extract the existing data rotation, as described above. Then, write the new header plus user data according to the extracted rotation.

The processes described above are performed by or at the direction of the controller. In one embodiment, all or most processes are supportable by firmware. Thus, code (e.g. firmware) can be embedded within the controller on a processor/controller readable storage medium such as flash memory, RAM, etc. for programming the controller. The code can also be stored in a memory element in communication with the Controller. Alternatively, specialized hardware can be included within the controller to perform many of those functions. Note that the term controller is somewhat generic for a processing device within the memory system that performs the functions described herein.

In one embodiment, all the methods discussed above are performed in real time. Quantifying the actual performance impact of using tracking cells varies based on the actual implementation. In the case of computing the rotation, the performance impact is minimal in that all of the associated operations can be done in a pipelined fashion at full processor speeds, with the tracking cell data being part of the normal data stream flow. Alternatively, with the implementations to invoke tracking cell processing described above, thirty sequential reads and many shift outs are required plus the time required for the controller to do the tracking cell processing computations, followed by a loading of the new read conditions and the final full read. It may be possible to reduce the ranges over which the threshold voltage reads is performed or be more clever in the threshold voltage read search algorithm (e.g. via a binary search for each population threshold midpoint). Nevertheless, given its rare incidence, the overall performance impact is anticipated to be minimal and far preferable to outright read failure or mis-correction.

The above examples are provided with respect to a specific flash memory system. However, the principles of the present invention have application to other types of flash memory systems as well as other types of memories (e.g. other integrated circuit/solid state/semiconductor memories), including those currently existing and those contemplated to use new technology being developed. The present invention is also applicable to non-electronic memories, including optical, magnetic and mechanical systems.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory system, comprising:
performing read operations on tracking storage elements in a portion of the memory system, threshold voltages of physical states of the tracking storage elements are further apart than threshold voltages of physical states of non-tracking storage elements in the portion of the memory system; and
determining, based on the read operations, an extent to which the tracking storage elements are errored.

2. The method of claim 1, wherein:
the threshold voltages of the physical states of the tracking storage elements are spaced apart, at a minimum, at least by a voltage corresponding to a spacing between two non-adjacent physical states of the physical states of the non-tracking storage elements.

3. The method of claim 1, wherein:
the determining an extent to which the tracking storage elements are errored comprises determining whether the tracking storage elements are in a set of preset tracking states.

4. The method of claim 1, further comprising:
determining a quality gauge based on the extent to which the tracking storage elements are errored.

5. The method of claim 4, further comprising:
responding to the quality gauge by at least one of aborting a read process, changing parameters of an error correction code process, and determining a new set of compare values for distinguishing states of the non-tracking storage elements.

6. A memory system, comprising:
tracking storage elements and non-tracking storage elements, threshold voltages of physical states of the tracking storage elements are further apart than threshold voltages of physical states of the non-tracking storage elements; and
at least one control circuit which performs read operations on the tracking storage elements and determines, based on the read operations, an extent to which the tracking storage elements are errored.

7. The memory system of claim 6, wherein:
the threshold voltages of the physical states of the tracking storage elements are spaced apart, at a minimum, at least by a voltage corresponding to a spacing between two non-adjacent physical states of the physical states of the non-tracking storage elements.

8. The memory system of claim 6, wherein:

the at least one control circuit determines an extent to which the tracking storage elements are errored by determining whether the tracking storage elements are in a set of preset tracking states.

9. The memory system of claim 6, wherein:

the at least one control circuit determines a quality gauge based on the extent to which the tracking storage elements are errored.

10. The memory system of claim 9, wherein:

the at least one control circuit responds to the quality gauge by aborting a read process.

11. The memory system of claim 9, wherein:

the at least one control circuit responds to the quality gauge by changing parameters of an error correction code process.

12. The memory system of claim 9, wherein:

the at least one control circuit responds to the quality gauge by determining a new set of compare values for distinguishing states of the non-tracking storage elements.

* * * * *